United States Patent [19]

Wessels et al.

[11] Patent Number: 4,801,557
[45] Date of Patent: Jan. 31, 1989

[54] VAPOR-PHASE EPITAXY OF INDIUM PHOSPHIDE AND OTHER COMPOUNDS USING FLOW-RATE MODULATION

[75] Inventors: Bruce W. Wessels, Wilmette, Ill.; Pei-Jih Wang, Carmel, N.Y.

[73] Assignee: Northwestern University, Evanston, Ill.

[21] Appl. No.: 65,726

[22] Filed: Jun. 23, 1987

[51] Int. Cl.$^4$ .......................................... H01L 21/205
[52] U.S. Cl. .............................. 437/81; 148/DIG. 57; 148/DIG. 65; 148/DIG. 119; 156/614; 156/610; 437/133; 437/949
[58] Field of Search ............... 148/DIG. 65, DIG. 56, 148/DIG. 110, DIG. 119, DIG. 169; 156/610-615; 437/102, 104, 105, 107, 113, 926, 937, 949, 133, 81; 427/255.1, 255.2

[56] References Cited

U.S. PATENT DOCUMENTS

| | | |
|---|---|---|
| 3,218,205 | 11/1965 | Ruehrwein . |
| 3,364,084 | 1/1968 | Ruehrwein . |
| 3,441,000 | 4/1969 | Burd et al. . |
| 3,511,723 | 5/1970 | Burd . |
| 3,617,371 | 11/1971 | Burmeister . |
| 3,721,583 | 3/1973 | Blakeslee . |
| 3,930,908 | 1/1976 | Jolly . |
| 4,115,163 | 9/1978 | Gorina et al. ........................ 437/102 |
| 4,146,774 | 3/1987 | Fraas . |
| 4,220,488 | 9/1980 | Duchemin et al. . |
| 4,314,873 | 2/1982 | Wieder et al. ........................ 156/610 |
| 4,368,098 | 1/1983 | Manasevit ........................ 437/104 |
| 4,482,423 | 11/1984 | Besomi et al. ........................ 156/622 |
| 4,504,329 | 3/1985 | Quinlan et al. . |

OTHER PUBLICATIONS

"Growth and Characterization of Vapor Deposited Indium Phosphide", Wessels and Inuishi, SPIE, vol. 323, Semi-Conductor Growth Technology (1982), p. 55.

*Primary Examiner*—Brian E. Hearn
*Assistant Examiner*—William Bunch
*Attorney, Agent, or Firm*—Welsh & Katz, Ltd.

[57] ABSTRACT

Chemical vapor deposition of III-V and II-VI binary, ternary and quaternary compounds is facilitated by maintaining a relatively high flow rate of reactants and modulating the rate of flow by alternately directing the flow at the high rate into a reactor for use and then directing the flow to a vent. Growth rates of the order of 25 Angstroms per minute were achieved in the epitaxial growth of indium phosphide by flow-rate modulation. This produced crystals of device quality having measured carrier mobilities of 2850-3600. In the case of epitaxial growth of ternary and quaternary compounds, improved control of deposition rates is achieved by applying flow-rate modulation to the compound carriers of each of the Group V and VI elements.

13 Claims, 1 Drawing Sheet

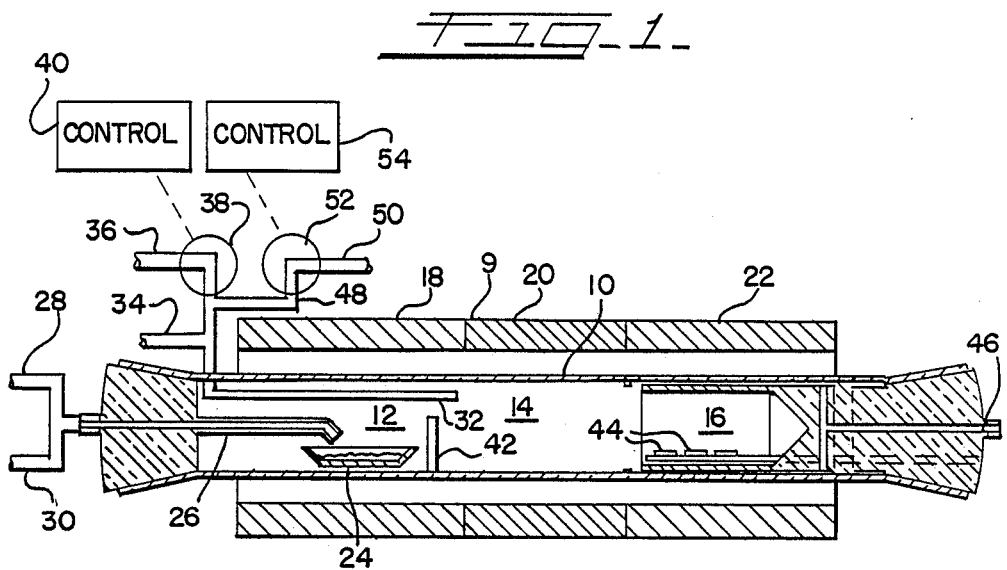
FIG-1
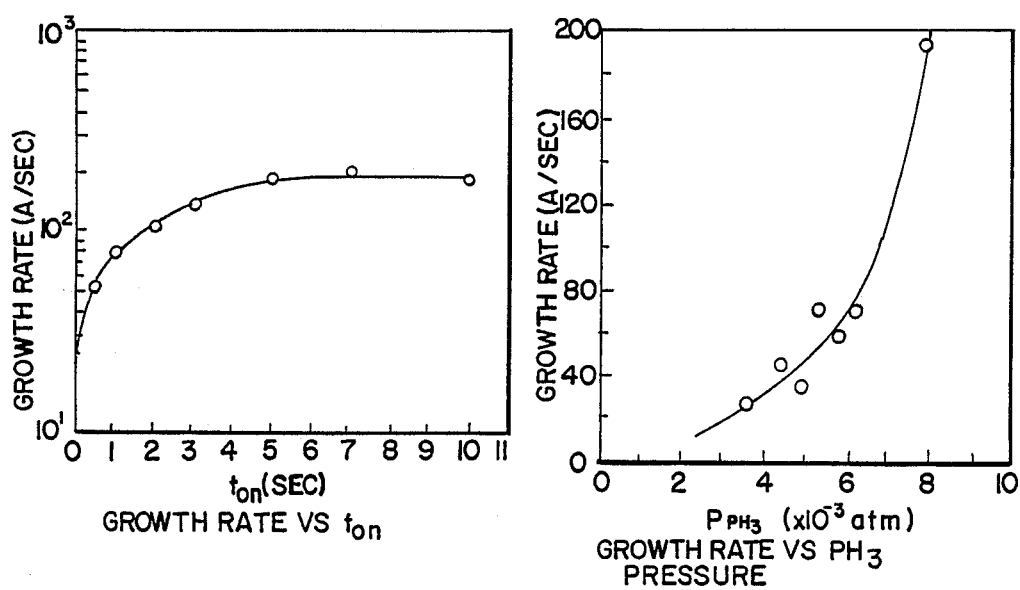
FIG-2
FIG-3

VAPOR-PHASE EPITAXY OF INDIUM PHOSPHIDE AND OTHER COMPOUNDS USING FLOW-RATE MODULATION

BACKGROUND OF THE INVENTION

This invention relates generally to vapor-phase epitaxy for the formation of thin films of semiconductor compounds, and more particularly, to an improved method and means for effecting hydride vapor-phase epitaxy.

Epitaxy is the formation of a crystal on a crystalline substrate so as to replicate in the deposited material the crystalline structure of the substrate. Vapor-phase epitaxy is the formation of an epitaxial layer of a substance or substances by using a gaseous carrier to transport into a reaction chamber the substance or substances to be deposited epitaxially. A typical example of a structure suitable for epitaxial deposition is disclosed in Burd et al., U.S. Pat. No. 3,441,000, "Apparatus and Method for Production of Epitaxial Films." Burd et al. disclose a reactor for hydride vapor-phase epitaxy having three zones or chambers; a reaction chamber, a mixing chamber, and a deposition chamber. Burd et al. state that the gases are introduced into the various chambers at a relatively high flow rate through nozzles or orifices so that considerable mixing results. Gases which may be used are hydrogen, phosphine or arsine, and hydrogen chloride. The mixed gases react to produce indium chloride or gallium chloride which serves as a carrier for the gallium or indium that is deposited epitaxially as a phosphide or arsenide on a substrate in the deposition chamber. A problem that has limited the use of hydride vapor-phase epitaxy is that high component flow rates cause excessive growth rates. As a result, the crystal structure that is produced is often not of device quality. Attempts to throttle down the flow rate of reactants tend to interfere with epitaxial growth and to lead to attack by the excess of hydrogen chloride that results, leading to etching of the surface that is subject to epitaxial growth. This etching also interferes with the epitaxial growth.

Another example of vapor-phase epitaxy is disclosed in Jolly, U.S. Pat. No. 3,930,908, "Accurate Control During Vapor Phase Epitaxy." Jolly teaches control of the flow rate of a gaseous reactant by the use of a rotary valve which permits flow of the reactant to be substantially continuous, but which either directs the flow of the reactant into the carrier stream or else directs that flow to be vented. Jolly suggests the desirability of adding an additional impurity in the form of a gaseous reactant, such as a conductivity modifier, into the reaction chamber in order to form a layer of the semiconductor material in which the conductivity modifier is present. Jolly further suggests that it is necessary to minimize the time it takes to introduce particular gaseous components into the reaction chamber in order to form the desired layers as quickly as possible. In his teachings, Jolly does not mention as of concern the difficulty of achieving substantially perfect replication of the lattice of the substrate. The quality of semiconductor devices formed by vapor-phase epitaxy is determined by the essentially complete absence of grain boundaries, so that the subject matter of epitaxial growth is a single crystal. Another figure of merit is represented by the substantial absence of dislocations within the crystalline structure. Such dislocations represent crystal defects which in general are detectable by measuring the mobilities of electrons and holes in the semiconductor material. It has been found that the best replication of crystalline structure is carried out at deposition rates of the order of 100 Angstroms per second or less, with good results being achieved at deposition rates of the order of 25 Angstroms per second or less. It is difficult to achieve deposition rates this low with steady-state flow of the type taught by Jolly.

Fraas, U.S. Pat. No. 4,146,774, "Planar Reactive Evaporation Apparatus for the Deposition of Compound Semiconducting Films," discloses epitaxial formation of compound semiconductor films, and particularly the formation of indium phosphide and gallium phosphide. Fraas teaches a structure for evaporation of the metallic component of a compound semiconducting material into a carrier stream that contains the nonmetallic element in compound form. Fraas requires residual gas pressures of less than $10^{-9}$ Torr, which are obtained by operation in a high-vacuum chamber and by employing a shroud that is cooled by liquid nitrogen. The necessity for pumping components into a high vacuum represents a disadvantage of the apparatus taught by Fraas.

Duchemin et al., U.S. Pat. No. 4,220,488, "Gas-Phase Process for the Production of an Epitaxial Layer of Indium Phosphide," teach a two-step reaction involving pyrolysis of phosphine to produce phosphorous which is reacted with triethyl indium to produce indium phosphide which is then deposited epitaxially on a substrate. This reaction is carried at a pressure which is low relative to atmospheric pressure and specifically is in the range of 70 to 80 Torrs. This process is referred to as organometallic vapor-phase epitaxy, and is widely used to produce epitaxial growth.

Blakeslee, U.S. Pat. No. 3,721,583, "Vapor-Phase Epitaxial Deposition for Forming Superlattice Structure," teaches a method of using a vapor-phase epitaxial deposition system for forming the physically abrupt layers that are necessary in superlattices. Blakeslee accomplishes this by injecting a particular component into the flowing stream when that component is to be deposited epitaxially and withholding that component from the flowing stream when its deposition is not desired. While Blakeslee refers to this as injecting pulses of the n component in a carrier gas separated by pulses of carrier gas into the $n-1$ component stream, it appears that his pulses are of sufficient length to supply one pulse per layer of the component in the superlattices. Accordingly, this method is different from the method disclosed and claimed below by the applicant.

In short, vapor-phase epitaxial deposition of semiconductor ingredients is well known. The objective of such processes is to achieve materials of desired crystalline structure and composition in the form of single crystals having no grain boundaries, essentially no or a very small number of crystal dislocations, and a controlled minimum number of unintentional dopants. The presence of unintended dopants is controlled by controlling the purity of carrier gases and reacting elements to limit the presence of undesired components. However, it has been observed that, to obtain device-quality semiconductors through epitaxial growth, the growth rate must be limited to minimize the development of an intolerable number of dislocations. For a steady-state supply of reacting components, it is often difficult to throttle the supply of components to a low enough level to provide a satisfactory epitaxial growth rate for high-quality thin-film applications.

SUMMARY OF THE INVENTION

It is an object of the present invention to provide an improved method and means of hydride vapor-phase epitaxial deposition of semiconductor materials.

It is a further object of the present invention to provide an improved method and means of epitaxial deposition of III-V compounds.

It is a further object of the present invention to provide an improved method and means of epitaxial deposition of II-VI compounds.

It is a further object of the present invention to provide an improved method and means of epitaxial deposition of mixed ternary and quaternary compositions of III-V and II-VI materials.

According to one embodiment of the invention, epitaxial growth of compounds is effected by passing a mixture of a first carrier gas and an active gas over a heated container containing a metal, reacting the resulting compound with a reactant that is subjected to flow-rate modulation, and directing the reacted flow at a crystal. In various specific embodiments of the invention, hydride vapor-phase deposition of III-V and II-VI binary, ternary and quaternary compounds is facilitated by maintaining a relatively high flow rate of reactants and modulating the rate of flow by alternately directing the flow at the high rate into a reactor for use and then directing the flow to a vent. Growth rates of the order of 25 Angstroms per minute were achieved in the epitaxial growth of indium phosphide by flow-rate modulation. This produced crystals of device quality having measured carrier mobilities of 2850–3600 $cm^2/V$-sec. In the case of epitaxial growth of ternary and quaternary compounds, improved control of deposition rates is achieved by applying flow-rate modulation to the compound carriers of each of the Group V and VI elements.

BRIEF DESCRIPTION OF THE DRAWINGS

The invention, together with further objects and advantages thereof may be understood by reference to the following description taken in conjunction with the accompanying drawings.

FIG. 1 is a schematic diagram of a reactor according to the present invention.

FIG. 2 is a plot of the growth rate of indium phosphide as a function of on time for an off time of five seconds.

FIG. 3 is a plot of the growth rate of indium phosphide as a function of the partial pressure of phosphine for a fixed modulation rate.

DETAILED DESCRIPTION OF THE INVENTION

Referring to FIG. 1, there is illustrated a sectional side view of a reactor 9 according to the present invention. The reactor 9 includes a tube 10 which encloses a reaction zone 12, a mixing zone 14 and a deposition zone 16. The reaction zone 12 is heated by a first heater 18. The mixing zone 14 may be heated by a second heater 20 and the deposition zone 16 is heated by a third heater 22. The heaters 18, 20 and 22 are controllable separately to provide for either the same or different temperatures in the three zones 12, 14 and 16. The reaction zone 12 includes a container 24, typically containing a Group III-A metal such as indium, gallium or boron. A tube 26 receives a carrier gas such as hydrogen in a line 28 and an active gas such as HCl in a line 30. A mixture of hydrogen and HCl is passed over the container 24 which is heated by the first heater 18 so that the indium, gallium, boron or other selected reactant placed in the container 24 is vaporized into the stream of gas from the tube 26 and reacts with it to form the chloride.

A second stream of components is introduced into the mixing zone 14 through a tube 32. A tube 34 carries a mixing gas which is preferably hydrogen, although satisfactory results have been achieved with helium and argon. A reactant is also introduced into the tube 34 through a tube 36 which passes through a three-way valve 38 of known design that is operated intermittently to modulate the flow of the reactant in the tube 36. The three-way valve 38 is operated by a control 40 which may provide either manual cycling or automatic cycling as by an electrical drive. The tube 36 typically carries as a reactant a hydride of an element of Group V-A such as phosphine, arsine, stibine or bismuthine. If the material in the container 24 is selected from Group IIA of the periodic table, then the reactant in the tube 36 is preferably a hydride of a Group VI-A element such as hydrogen sulfide, hydrogen selenide or hydrogen telluride.

The gases in the tube 26 pass over the heated container 24 where they pick up vapor from the container 24. A barrier 42 prevents contamination of the material in the container 24 by back-streaming of gases from the tube 32 into the reaction zone 12. Mixing of the components takes place in the mixing zone 16, and the mixed components are swept into the deposition zone 14 where they are deposited to grow epitaxially on a substrate 44. The velocity of flow is increased by reducing the cross-sectional area of the deposition zone 16 to a smaller value than the cross-sectional area of the mixing zone 14. The zones 12, 14 and 16 are typically at or near atmospheric pressure, and the pressure and flow are controlled in part by exhausting the deposition zone through a vent line 46.

The elements described above are those suitable to perform hydride vapor epitaxial deposition of binary compounds. If it is desired to deposit a ternary or quaternary compound, or a superlattice structure in which two or more compounds are deposited alternately, one or more additional structures such as a tube 48 can be supplied with an additional reactant through a tube 50 that passes the reactant through a three-way valve 52. The three-way valve 52 is controlled by a control 54, which may represent manual rotation of the three-way valve 52 or automatic operation by mechanical or electrical means. The three-way valve 52 connects the source either to the reactor or to a vent to maintain flow from the source and minimize pressure transients at the valve 52 when the source is not connected to the reactor 9. A similar structure could be added to provide for the injection of another reactant to produce quaternary structures. A second element from Group III-A may be deposited by adding another tube 26 in the reaction zone 12 and a second container 24 for the second element, and supplying the carrier and the active gas first at one container 24 and then at the other.

The most widely used techniques for growing atomically abrupt multi-layer thin films of binary, ternary and quaternary compounds have been molecular beam epitaxy and organometallic vapor-phase epitaxy. Hydride vapor-phase epitaxy has been used less because its relatively high growth rates have made it more difficult to prepare abrupt interfaces. In accordance with the present invention, the flow of one or more reactants is modulated by cycling a valve in the reactant line so that the peak value of flow is at a level that is readily controlled, while the average value is selectable as desired by selecting a wave form, frequency, and duty cycle that is appropriate. The valve preferably permits the flow of reactant to be vented when it is not switched for delivery to the mixing zone of the reactor, so that pressure build-up is avoided during the off cycle. This contributes to smooth controlled flow.

Example One

In a specific example of hydride vapor-phase epitaxy, according to the invention, indium phosphide was prepared in the illustrated embodiment of reactor 9 of FIG. 1. The container 24 contained indium, heated to 750° C. The line 28 contained hydrogen at a flow rate of 220 ml/minute, and the line 30 contained HCl gas, flowing at 2 ml/minute. The mixture of hydrogen and HCl was passed over the indium in the container 24 to carry a mixture of hydrogen, HCl, and indium chloride into the mixing zone 14. The line 34 was supplied with hydrogen at a flow rate of 330 ml/minute, and the line 36 delivered phosphine ($PH_3$) at a rate of 4 ml/minute. The amount of phosphine injected into the tube 32 was varied by varying the duty cycle of closure of the valve 38. The reaction zone 12 was maintained at a temperature of 800° C., and the deposition zone 16 was maintained at a temperature of 640° C. For various growth times and duty cycles, the parameters described produced the results listed in Table 1.

TABLE 1

Electrical Properties of Epitaxial InP

| Sample # | Total thick. (micro meters) | Growth rate (Å/sec) | On/Off time (Sec/sec) | Cycles | Resistivity (ohm-cm) | Carrier Density ($\times 10^{16}$ cm$^{-3}$) | Mobility (cm$^2$/V-sec) |
|---|---|---|---|---|---|---|---|
| 1 | 1.5 | 125 | 2/8 | 60 | 0.348 | 0.52 | 3450 |
| 2 | 3.5 | 194 | 1/9 | 180 | 0.042 | 4.2 | 3540 |
| 3 | 1.2 | 67 | 1/9 | 180 | 0.031 | 5.5 | 3650 |
| 4 | 1.0 | 55 | 1/9 | 180 | 0.039 | 5.0 | 3210 |
| 5 | 1.2 | 33 | 1/9 | 360 | 0.011 | 19.0 | 2950 |
| 6 | 2.6 | 24 | 3/7 | 360 | 0.037 | 6.0 | 2810 |

The total layer thicknesses indicated in Table 1 were obtained by optical measurements of stained cross-sections, and the growth rate was taken as an average value obtained by dividing the layer thickness by the deposition time. The resistivity, carrier concentration and Hall mobility were measured using the Van der Pauw technique. This is a four-probe measuring system, with probes placed on the periphery of the sample to measure voltages and currents. Inspection of the indium phosphide using a scanning electron microscope and a Normarski contrast optical microscope indicated that decomposition of the indium phosphide by HCl during the off time was minimal or nonexistent. No surface texture was observed by scanning electron microscopy at a magnification of 5000X. X-ray diffractometer measurements indicated that the layers deposited epitaxially were single crystals.

Table 2 lists the range of values over which device-quality indium phosphide (InP) has been obtained by hydride vapor-phase epitaxial (VPE) deposition using the apparatus of FIG. 1 with the preferred values of Table II.

TABLE II

| Growth Parameters for VPE of InP | | | |
|---|---|---|---|
| | Minimum | Preferred | Maximum |
| Temperature of Mixing Zone °C. | 750 | 800 | 875 |
| Temperature of Reaction Zone °C. | 700 | 750 | 825 |
| Temperature of Deposition Zone °C. | 590 | 640 | 690 |
| Total Flow ($H_2$) ml/min | 200 | 550 | 3000 |
| Over Container | 80 | 220 | 1200 |
| Carrying $PH_3$ | 120 | 330 | 1800 |
| HCl Flow ml/min | 1 | 2 | 15 |
| $PH_3$ flow ml/min | 1 | 2-4 | 15 |

FIG. 2 is a plot of the growth rate of indium phosphide as a function of on time for an off time of five seconds. In FIG. 2, the flow rate of both HCl and phosphine was maintained at 2 ml/min. The growth rate is seen to become approximately constant at and above an on time of five seconds, representing duty cycles of 50% and greater. Below five seconds of on time, the growth rate is reduced from its maximum value of approximately 180 Angstroms per second to a value of approximately 50 Angstroms per second for an on time of 0.5 seconds. This demonstrated ability to control the growth rate was combined with the results of visual inspection that showed that the quality of epitaxial deposit was improved as the growth rate was reduced. It has previously been observed that reducing the flow rate to achieve lowered growth rates and high quality is very difficult.

FIG. 3 is a plot of the growth rate of indium phosphide as a function of the partial pressure of phosphine for an on time of one second and an off time of nine seconds. A comparison of the curves of FIGS. 2 and 3 shows that the growth rate as a function of the partial pressure of phosphine is generally erratic at growth rates below about 80 Angstroms per second whereas the control of the growth rate is smooth and effective when the duty cycle is varied as shown in FIG. 2.

Example Two

A superlattice of indium phosphide and indium arsenide has been deposited epitaxially on indium phosphide substrates using the apparatus of FIG. 1. In forming the superlattice, hydrogen was introduced in the line 28, and HCl was introduced in the line 30. Indium was heated in the container 24. Phosphine ($PH_3$) was introduced in the tube 36 and arsine ($AsH_3$) was introduced in the tube 50. Control of the relative concentrations of arsenide and phosphide in the superlattice grown on the substrate 44 is readily effected by varying the duty cycles produced by the controls 40 and 54. When phosphine is supplied by flow-rate modulation for a period of time and then arsine is supplied by flow-rate modulation for a period, and this sequence is repeated, the epitaxial growth produces a superlattice of alternate layers. When phosphine and arsine are both supplied simultaneously and subjected to flow-rate modulation, the result is a ternary compound $InP_xAs_{1-x}$ where x is a number between zero and one that is a function of the relative amounts of phosphine and arsine that enter the mixing zone 14. Similar superlattice compounds of different metals from Group III can be made by alternately passing a carrier gas and an active gas over a container of gallium and then over a container of indium. If both are used at once, the result is epitaxial deposition of $In_xGa_{1-x}P$ or other such compound.

Specific embodiments of the novel flow-modulation epitaxy system have been described for the purpose of illustrating the best mode known to the inventors of practicing the invention. It should be understood that implementation of other variations and modifications of the invention in its various aspects will be apparent to those skilled in the art, and that the invention is not limited by the specific embodiments described. It is therefore contemplated to cover by the present invention any and all modifications, variations or equivalents that fall within the spirit and scope of the basic underlying principles disclosed and claimed herein.

What is claimed is:

1. A method of effecting epitaxial growth of a crystal on a crystalline substrate comprising the steps of:
   a. passing a continuous flow of a mixture of a first carrier gas and an active gas over a heated container containing a metal to form a vapor stream containing a compound of the metal;
   b. producing a flow of a second carrier gas and a first reactant gas;
   c. modulating the flow of the first reactant gas to produce a repeatedly interrupted flow of the first reactant gas at a predetermined frequency and duty cycle;
   d. mixing the flow of the second carrier gas and the modulated flow of the first reactant gas with the vapor stream in a reaction region;
   e. continuously directing the mixed flow of the vapor stream, the second carrier gas and the modulated flow of the first reactant gas from the reaction region into a deposition region containing the crystalline substrate heated to a predetermined temperature; and
   f. venting the mixed flow from the deposition region, whereby a compound of the active gas and the first reactant gas is deposited epitaxially on the crystalline substrate.

2. The method of claim 1 wherein the first and second carrier gases are hydrogen.

3. The method of claim 2 wherein the active gas is hydrogen chloride.

4. The method of claim 3 wherein the metal is indium.

5. The method of claim 3 wherein the metal is gallium.

6. The method of claim 4 wherein the first reactant gas is phosphine.

7. The method of claim 4 wherein the first reactant gas is arsine.

8. The method of claim 4 wherein the first reactant gas is bismuthine.

9. The method of claim 5 wherein the first reactant gas is phosphine.

10. The method of claim 5 wherein the first reactant gas is arsine.

11. The method of claim 5 wherein the first reactant gas is bismuthine.

12. The method of claim 6 wherein the step of modulating comprises the step of directing the flow of the phosphine into the second hydrogen flow during an on-time and into a vent during an off-time.

13. The method of claim 1 comprising in addition the steps of:
   a. producing a flow of a third carrier gas and a second reactant gas;
   b. modulating the flow of the second reactant gas at a second predetermined frequency and duty cycle;
   c. mixing the modulated flow of the second reactant gas and the flow of the third carrier gas with the mixed flow of the vapor stream, the second carrier gas and the modulated flow of the first reactant gas in the reaction region to produce a second mixed flow;
   d. directing the second mixed flow into the deposition region; and
   e. venting the secod mixed flow from the deposition region.

* * * * *